United States Patent
Yamaoka et al.

[11] Patent Number: 5,913,138
[45] Date of Patent: Jun. 15, 1999

[54] METHOD OF MANUFACTURING AN ANTIFUSE ELEMENT HAVING A CONTROLLED THICKNESS

[75] Inventors: Toru Yamaoka; Hiroshi Sakurai, both of Kyoto; Hirotsugu Honda, Nagaokakyo; Hiroshi Yuasa, Osaka, all of Japan

[73] Assignee: Matsushita Electronics Corporation, Osaka, Japan

[21] Appl. No.: 08/806,799

[22] Filed: Feb. 26, 1997

[30] Foreign Application Priority Data

Aug. 8, 1996 [JP] Japan ................................ 8-209937

[51] Int. Cl.$^6$ .................................................. H01L 29/00
[52] U.S. Cl. ............................................ 438/600; 438/131
[58] Field of Search ..................................... 438/130–132, 438/467, 600–601

[56] References Cited

U.S. PATENT DOCUMENTS

| | | | |
|---|---|---|---|
| 5,196,724 | 3/1993 | Gordon et al. | 257/751 |
| 5,440,167 | 8/1995 | Iranmanesh | 257/530 |
| 5,682,058 | 10/1997 | Iranmanesh | 257/530 |
| 5,763,299 | 6/1998 | McCollum et al. | |
| 5,804,500 | 9/1998 | Hawley et al. | |

FOREIGN PATENT DOCUMENTS

| | | |
|---|---|---|
| 0 483 958 | 5/1992 | European Pat. Off. |
| 0 660 408 | 6/1995 | European Pat. Off. |
| 5-198681 | 6/1993 | Japan |
| WO 930449 | 3/1993 | WIPO |
| WO 9405041 | 3/1994 | WIPO |
| WO 9510121 | 4/1995 | WIPO |
| WO 9641374 | 12/1996 | WIPO |

*Primary Examiner*—Jey Tsai
*Attorney, Agent, or Firm*—McDermott, Will & Emery

[57] ABSTRACT

The present invention relates to the method of manufacturing an antifuse element having an antifuse layer formed between interconnection layers. Conventionally, an antifuse layer was formed after an aperture was formed through an interlayer insulating film. Such resulted in a thinner film thickness at the corner formed by inner wall surface of the aperture and a lower electrode layer. As it is very difficult to control the film thickness of the thinnest part to a specific value, control of the insulation breakdown voltage in "off" state was difficult. The present antifuse element includes a layer with a flat shape of an even thickness. The layer is a complexed film of amorphous silicon film, silicon nitride film and silicon oxide film. The antifuse electrode layer is of a titanium nitride, the film thickness of which is thicker than the invasion length of a fuse link into electrode layers. The step coverage of upper electrode layer is set to be higher than 80%, by controlling the film thickness of the insulation film separating the electrodes and the tapered shape of the aperture in the antifuse region.

2 Claims, 4 Drawing Sheets

METHOD OF MANUFACTURING AN ANTIFUSE ELEMENT HAVING A CONTROLLED THICKNESS

FIELD OF THE INVETNION

The present invention is related to an antifuse element, an element limelighted as a most prospective programmable element, in particular an antifuse element having antifuse layer formed between the interconnection layers; as well as a method of manufacture therefor.

BACKGROUND OF THE INVENTION

FIG. 3 shows a cross sectional structure of a conventional antifuse according to Japanese Patent Laid-open No. 5-190677. The antifuse element comprises a first interlayer insulating film 1, a first metal interconnection layer 2, a lower electrode layer of antifuse element 3, a second interlayer insulating film 4, an aperture 4a formed through the second interlayer insulating film 4, an antifuse layer 5, an upper electrode layer 6 of the antifuse element, a second metal interconnection layer 8, and a barrier metal layer 7 disposed between the upper electrode layer 6 and the second metal interconnection layer 8.

The antifuse layer 5 is generally comprised of an amorphous silicon etc.; the upper electrode layer 6 and the lower electrode layer 3 are of a refractory metal such as titanium (Ti), and the first metal interconnection layer 2 and the second metal interconnection layer 8 are of an aluminum alloy.

Antifuses work as the insulating element in normal state; but when a voltage higher than the insulation breakdown voltage is applied on the antifuse layer 5 (programming), an electroconductive channel (hereinafter referred to a fuse link) is formed between the upper electrode layer 6 and the lower electrode layer 3, and the antifuse turns from an insulating element ("off" state) into a resistive element ("on" state).

In the logic semiconductor integrated circuits or the read-only memories (ROM) etc., the antifuse elements placed between interconnection lines are selectively electroconducted to provide semiconductor integrated circuits with a specific function, or ROMs with a specific program.

A method for manufacturing a conventional antifuse element as shown in FIG. 3 will be described referring to cross sectional views of FIG. 4(a)–FIG. 4(d).

As FIG. 4(a) shows, a first interlayer insulating film 1 is formed on a semiconductor substrate (not shown) having specific circuit elements and insulating films integrated. After the surface is planarized, a first metal interconnection layer 2 and a lower electrode layer 3 are formed. Then a second interlayer insulating layer 4 is formed covering the lower electrode layer 3 and the first metal interconnection layer 2, and an aperture 4a is formed to expose a portion on which the antifuse element is to be formed, as shown in FIG. 4(b). An antifuse layer 5 comprised of an amorphous silicon etc. and an upper electrode layer 6 are formed as shown in FIG. 4(c). A barrier metal layer 7 and a second metal interconnection layer 8 are formed as shown in FIG. 4(d).

However, various problems have been found with the conventional antifuse elements. A problem is the difficulty in controlling the insulation breakdown voltage in "off" state. As the antifuse layer 5 is formed after an aperture is formed through the second interlayer insulating film 4, thickness of the layer at the corner shaped by inner wallsurface of aperture 4a and the lower electrode layer tends to be thinner than the other portion; furthermore, it is very difficult to control the thickness of the thinnest part to a specified value.

Because the antifuse layer 5 uses an amorphous silicon etc. as a constituent material, the polarity control of current/voltage characteristics of antifuses in "off" state, namely control of the dependence of leakage current on bias direction, is difficult, it is also difficult to suppress a high leakage current of antifuse element in "off" state, and during the manufacturing process of antifuse elements, the film of amorphous silicon etc. easily causes a peeling-off.

Because the upper electrode layer 6 and the lower electrode layer 3 of antifuse element are comprised of a refractory metal, if the film thickness of upper electrode layer 6 or lower electrode layer 3 of a fuse link portion to be formed during the programming of antifuse element is too thin the fuse link invades into the first metal interconnection layer 2 or the second metal interconnection layer 8, allowing the aluminum constituting the first metal interconnection layer 2 or the second metal interconnection layer 8 to diffuse into the fuse link. This deteriorates the reliability of antifuse element in "on" state.

In a case where titanium (Ti) is used as a refractory metal of upper electrode layer 6 and lower electrode layer 3, the titanium reacts with the amorphous silicon during heating in the process, which brings about an increasing dispersion in the insulation breakdown voltage of antifuse element in "off" state.

As the second interlayer insulating film 4 for separating the first matal interconnection layer 2 and the second metal interconnection layer 8 is used also as an insulating film for separating the lower electrode layer 3 and the upper electrode layer 6, the aperture 4a naturally has a large aspect ratio, making it difficult to control the thickness of the thinnest part of upper electrode layer 6.

SUMMARY OF THE INVENTION

The present invention is aimed to present an antifuse element in which the polarity in current/voltage characteristics of an antifuse element in "off" state is controllable, the leakage current in "off" state is suppressed, dispersion of the insulation breakdown voltage in "off" state is suppressed, the deteriorated reliability in "on" state is mitigated; as well as to present a method for manufacturing antifuse elements, with which method the occurrence of peeling-off of an insulating film during manufacturing process is prevented.

An antifuse element according to the present invention comprises a first interconnection layer formed on an insulating film, a flat lower electrode layer formed on a planarized region of the first interconnection layer, a flat antifuse layer formed on the lower electrode layer, an upper electrode layer formed on the antifuse layer, and a second interconnection layer coupled with the upper electrode layer.

A method for manufacturing an antifuse element according to the present invention comprises the steps of forming a first interconnection layer on an insulating film, forming a flat lower electrode layer on a planarized region of the first interconnection layer, forming an electrodes separating insulation film to cover the lower electrode layer and the antifuse layer, forming an aperture through the electrodes separating insulation film to expose the antifuse layer, and forming an upper electrode layer covering the aperture.

DETAILED DESCRIPTION OF THE INVENTION

Figure 1:
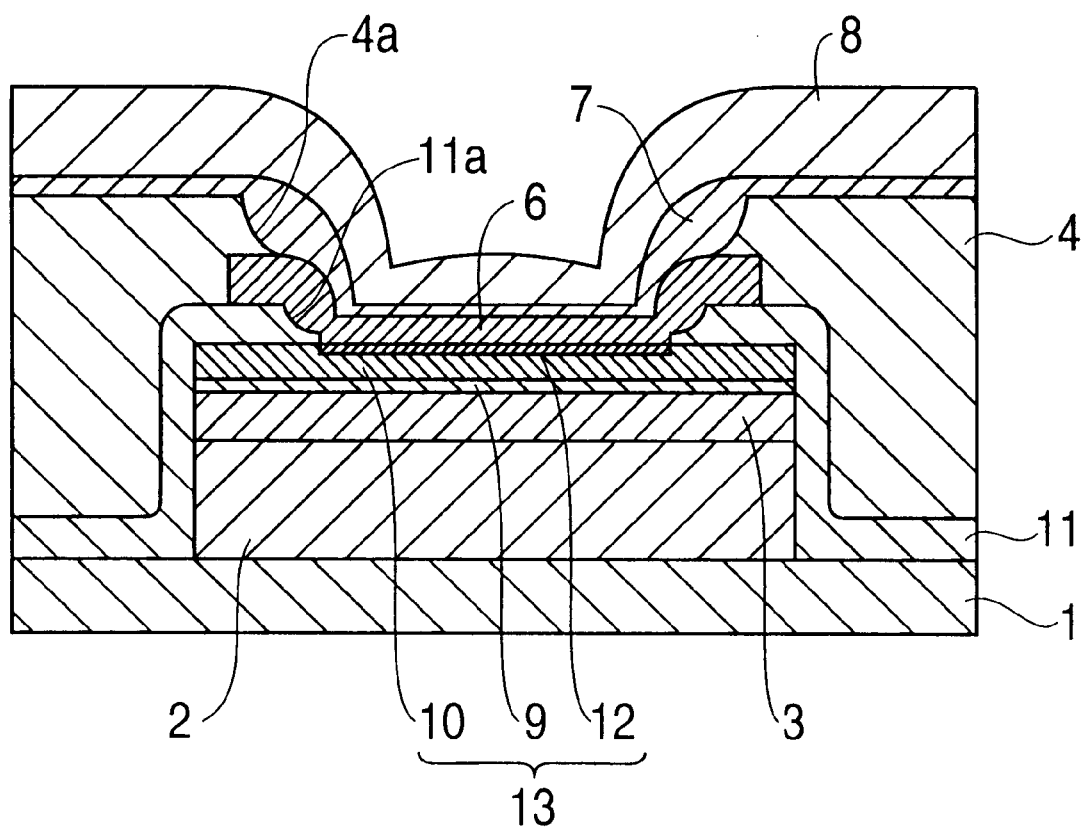
FIG. 1 is a cross sectional view showing an antifuse element according to an embodiment of the present invention.

The present invention comprises an antifuse layer formed flat on a lower electrode. Thereby, the layer has an even thickness at least in a portion where the lower electrode and the upper electrode are to contact. This makes control of the insulation breakdown voltage of antifuse elements in "off" state easy.

The present invention comprises an antifuse layer having an even layer thickness. Different from a conventional antifuse layer, which is formed after an aperture is provided through the interlayer insulating film 4, the invented antifuse layer does not cause an uneven layer thickness. This makes control of the insulation breakdown voltage in "off" state easy.

The present invention comprises an antifuse layer comprised of a silicon nitride film, an amorphous silicon film and a silicon oxide film. This makes it possible to control the polarity of current/voltage characteristics of an antifuse element in "off" state, suppress the leakage current of antifuse element in "off" state, and prevent the occurrence of peeling-off of amorphous silicon film during the manufacturing process of antifuse element.

The present invention comprises an antifuse layer comprised of a silicon nitride film provided on amorphous silicon film in the surface facing the lower electrode, and a silicon oxide film in the surface facing the upper electrode. The silicon nitride film disposed on the amorphous silicon film in the surface facing the lower electrode enables the polarity control of current/voltage characteristics of antifuse elements in "off" state, and prevents the occurrence of peeling-off of amorphous silicon film during manufacturing of an antifuse element. The silicon oxide film disposed on the amorphous silicon film in the surface facing the upper electrode suppresses the leakage current of antifuse element in "off" state.

The present invention comprises an upper electrode layer and a lower electrode layer each having a layer thickness greater than the length of an electroconductive channel, or a fuse link, to be formed in the antifuse layer when a voltage is applied between the upper electrode layer and the lower electrode layer, invading into the electrode layers. With the above structure, the fuse link will have contact with neither the first interconnection layer, nor the second interconnection layer. This prevents the deterioration of reliability of an antifuse element in "on" state.

The present invention comprises an antifuse element the both electrodes of which are comprised of a titanium nitride film. This suppresses dispersion of the insulation breakdown voltage of an antifuse element in "off" state.

The present invention comprises an antifuse element comprising a first interconnection layer formed on an insulating film; a flat lower electrode layer formed on a planarized region of the first interconnection layer; an antifuse layer formed on the lower electrode layer; an electrodes separating insulation film formed to cover the antifuse layer, the lower electode layer and the first interconnection layer, having a first aperture on the antifuse layer; an upper electrode layer formed covering the first aperture; an interlayer insulating film having a second aperture for exposing a part of the upper electrode layer; a second interconnection layer formed to have a contact with the upper electrode layer through the second aperture of the interlayer insulating film; wherein the film thickness the electrodes separating insulation film is thinner than that of the interlayer insulating film. This makes it possible to control the insulation breakdown voltage of antifuse element in "off" state.

The present invention comprises a first aperture which has a tapered shape, narrower in the antifuse side and broader in the opposit direction, or upward direction in the drawing, wherein the film thickness of the thinnest part of the upper electrode layer in the tapered stepping section is controlled to fall within a range between 80% to 90% of the thickest part of the upper electrode layer. This prevents the deterioration of reliability of antifuse element in "on" state.

The present invention comprises a method for manufacturing an antifuse element, which comprises the steps of forming a first interconnection layer on an insulating film; forming a flat lower electrode layer on a flattened region of the first interconnection layer; forming a flat antifuse layer on the lower electrode layer; forming an electrodes separating insulation film covering the first interconnection layer, the lower electrode layer and the antifuse layer; forming an aperture through the electrodes separating insulation film to expose the antifuse layer; and forming an upper electrode layer covering the aperture. This makes it possible to control the insulation breakdown voltage of antifuse element in "off" state.

The present invention comprises a method for forming an antifuse layer comprising the steps of forming a silicon nitride film on a lower electrode layer, forming an amorphous silicon film, and forming a silicon oxide film. This makes it possible to control the polarity of the current/voltage characteristics of an antifuse element in "off" state, suppress the leakage current of antifuse element in "off" state, and prevent the occurrence of peeling-off of amorphous silicon film during the manufacturing process.

The present invention comprises a method for forming a silicon oxide film, wherein an amorphous silicon film is first formed, and then a silicon oxide film is formed on the surface of amorphous silicon film by means of a plasma oxidation. This suppresses the leakage current of antifuse element in "off" state.

The present invention comprises an antifuse layer of an amorphous silicon film, which is formed by first forming an aperture through an electrodes separating insulation film to expose the antifuse layer, and then by plasma-oxidizing the surface of amorphous silicon film. This suppresses the leakage current of antifuse element in "off" state.

The present invention comprises a process for forming an aperture through an electrodes separating insulation film to expose the antifuse layer, which comprises a process for selectively forming an etching mask on the electrodes separating insulation film, and a process for conducting a dry-etching after wet-etching. This improves the step coverage of the upper electrode layer at the stepping portion of aperture, as well as the rate of plasma oxidization.

The present invention comprises a process for plasma-oxidizing the surface of amorphous silicon film, which process also removes a photoresist film used for forming an aperture through an electrodes separaing insulation film by treating it in the oxygen plasma, at the same time oxidizes the surface of amorphous silicon film by the oxygen plasma. This simplifies the manufacturing process.

Now in the following, preferred embodiments of the present invention will be described with reference to drawings. FIG. 1 shows a cross sectional structure of an antifuse element according to an embodiment of the present invention.

As shown in FIG. 1, a first interlayer insulating film 1 is formed on a semiconductor substrate (not shown) having specified circuit elements and insulating films provided through a known semiconductor integrated circuits manufacturing technology. A first interconnection layer 2 and a lower electrode layer 3 of antifuse element are formed one after another on the first interlayer insulating film 1 to create a specified pattern. Among the first interconnection layer 2 and the lower electrode layer 3, the surface of at least lower electrode layer 3 is finished flat.

On top of the lower electrode layer 3, a silicon nitride film 9 and an amorphous silicon film 10 are formed one after another with specified film thicknesses, further on the amorphous silicon film 10 a silicon oxide film 12 is selectively formed in a region along the surface. A complex film comprised of these silicon nitride film 9, amorphous silicon film 10 and silicon oxide film 12 constitutes an antifuse layer 13 having a specified layer thickness.

An electrodes separating insulation film 11 covers a region on the first interlayer insulating film 1 excluding at least the region on which the antifuse layer 13 is to be formed, the first interconnection layer 2, the side and a portion of the amorphous silicon film 10 of antifuse layer 13. A first aperture 11a is selectively formed through the electrodes separating insulation film 11 in a region on the amorphous silicon film 10. The above described silicon oxide film 12 has been formed through oxidization of the surface of amorphous silicon film 10 in a region of aperture 11a, being a region not covered by the electrodes separating insulation film 11. The aperture 11a formed through electrodes separating insulation film 11 has a tapered shape with a portion of the edge removed, narrower to the side facing the amorphous silicon film 10 and broader to the opposite direction. An upper electrode layer 6 of antifuse element is formed over the aperture 11a of electrodes separating insulation film 11 and having a contact with the silicon oxide film 12 of antifuse layer 13. The upper electrode layer 6 further spreads covering the inner wall surface as well as around the neighbourhood region of the aperture 11a of the electrodes separating insulation film 11.

On the electrodes separating insulation film 11 and the upper electrode layer 6, a second interlayer insulating film 4 is formed in a selected region. A second aperture 4a is formed with a tapered shape broadening wider from the upper electrode layer 6 towards the outer surface through the second interlayer insulating film 4 in a region on the upper electrode layer 6. A barrier metal layer 7 is formed over the second interlayer insulating layer 4 contacting with the upper electrode layer 6 in the second aperture 4a; further on top, a second interconnection layer 8 is formed.

The upper electrode layer 6 and the lower electrode layer 3 are comprised of a refractory metal such as titanium nitride (TiN), while the first interconnection layer 2 and the second interconnection layer 8 are comprised of an aluminum alloy (Al alloy), for example Al—Si—Cu alloy or Al—Cu alloy. The thickness of upper electrode layer 6 and lower electrode layer 3 is greater than the invading length of a fuse link to be formed after the programming into the electrode layers.

In the present embodiment, antifuse layer 13 comprised of silicon nitride film 9, amorphous silicon film 10 and silicon oxide film 12 is formed flat on the first interconnection layer 2 via the flat-surfaced lower electrode layer 3. The film thickness of antifuse layer 13 is therefore even, and the control of film thickness is easy. This makes it easy to control the insulation breakdown voltage of antifuse element in "off" state to a specified value.

The present embodiment has been structured on a presumption that the programming is made by applying a voltage of a certain polarity between the upper electrode layer 6 and the lower electrode layer 3 so that the upper electrode layer 6 becomes positive with respect to the lower electrode layer 3. In this case, the insulation breakdown voltage should preferably be lower and the leakage current level be higher, as compared with a case of programming with a voltage having the reverse polarity.

In the present embodiment, the antifuse layer 13 has a complex film structure having a silicon nitride film 9 in the lower electrode layer 3 side, and a silicon oxide film 12 in the upper electrode layer 6 side, respectively, of the amorphous silicon film 10. Therefore the programming is made with a voltage of a certain polarity with which the upper electrode layer 6 is made positive against the lower electrode layer 3, and the leakage current of antifuse element in "off" state reduced. Furthermore, the occurrence of peeling-off of amorphous silicon film 10 during the manufacturing process of antifuse element is prevented.

It has been known that if a fuse link formed after programming contained aluminum the reliability of antifuse element in "on" state deteriorates. The thicknesses of upper electrode layer 6 and lower electrode layer 3 of an antifuse element according to the present embodiment are thicker than the invading length of a fuse link into the electrode layers; therefore, the fuse link never reaches the first interconnection layer 2 nor second interconnection layer 8, which means that an aluminum constituting the first interconnection layer 2 or second interconnection layer 8 never diffuse into the fuse link. The deterioration of reliability of an antifuse element in "on" state is prevented.

By constituting the upper electrode layer 6 and lower electrode layer 3 with a titanium nitride, the chemical reaction which happens during the heat treatment process of antifuse layer 13 is prevented, and dispersion in the insulation breakdown voltage of antifuse element in "off" state is suppressed.

Further, by making the film thickness of the electrodes separating insulation film 11 thinner than that of the interlayer insulating film 4, the insulation breakdown voltage of antifuse element in "off" state comes under control.

Furthermore, by providing the first aperture 11a with a tapered shape broadening towards the upward directon, and setting the film thickness of the thinnest part of upper electrode layer 6 in the stepping section to fall within a range 80%–90% that the thickest part of upper electrode layer 6, it turns out possible to control the thickness of upper electrode layer 6. This prevents the reliability of antifuse element in "on" state from deteriorating, which is due to aluminum diffused into a fuse link as a result of the fuse link formed after programming invading into the second interconnection layer 8.

Although in the description of present embodiment the antifuse layer 13 has been constituted as a complex film and the first aperture 11a should preferably have a tapered shape, the antifuse layer 13 may be constituted in a single layered structure for obtaining the same effect of the present invention which enables control of the insulation breakdown voltage of an antifuse element in "off" state, in so far as an even thickness of the antifuse layer 13 is basically assured.

FIG. 2(a) through FIG. 2(f) are cross sectional charts of the antifuse element of FIG. 1 showing a manufacturing process flow according to an embodiment of the present invention.

Figure 2A:
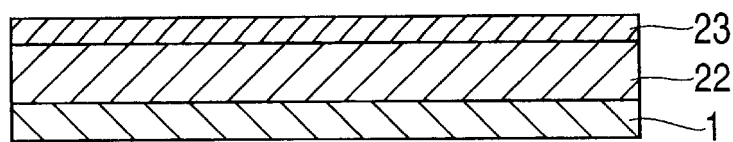
FIG. 2(a), FIG. 2(b), FIG. 2(c), FIG. 2(d), FIG. 2(e) and FIG. 2(f) are charts explaining a process for manufacturing an antifuse element according to an embodiment of the present invention.

A first interlayer insulating film 1 is formed on a semiconductor substrate (not shown) having specified circuit elements and insulaing film. After planarizing the surface of first interlayer insulating film 1, a metal layer 22 which is to become a first interconnection layer 2 and a metal layer 23 which is to become a lower electrode layer 3 of antifuse element are formed on the first interlayer insulating film 1, as shown in FIG. 2(a). The metal layer 22 is comprised of an aluminum alloy, e.g. an Al—Si—Cu alloy or an Al—Cu alloy, 500–1000 nm thick. The metal layer 23 is comprised of a titanium nitride, 200–300 nm thick. The length of a fuse link to be formed after the programming is normally 50–150 nm.

Figure 2B:
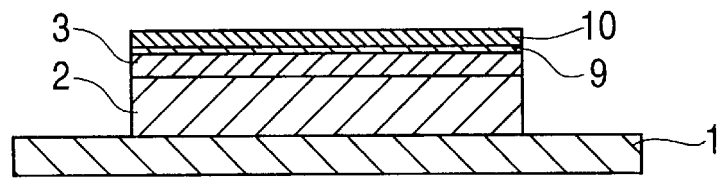

Then, as shown in FIG. 2(b), a silicon nitride film and an amorphous silicon film are formed one after another on the matal layer 23 which is to become a lower electrode layer 3 of antifuse element, and then leaving an area of specific pattern by selectively removing the rest of the area, a first interconnection layer 2, a lower electrode layer 3 of antifuse element, and a silicon nitride film 9 and an amorphous silicon film 10 constituting an antifuse layer, are formed. Through the above described process, an antifuse layer is formed on the first interconnection layer 2 for a specified thickness. The film thickness of silicon nitride film 9 is 5–10 nm, amorphous silicon film 10 is 50–100 nm thick.

Figure 2C:
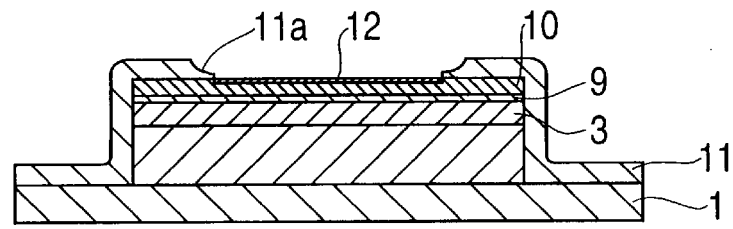

Then, as shown in FIG. 2(c), an electrodes separating insulation film 11 is formed for the thickness of 100–300 nm, preferably 150–250 nm, by means of a plasma CVD using tetraethoxysilane (TEOS), and then the shoulder of the electrodes separating insulation film 11 corresponding to edge of the first interconnection layer 2 is smoothed by sputtering or such other method. A first aperture 11a is formed by covering the electrodes separating insulation film 11 with an etching mask (not shown) of a resist material excluding an area corresponding to the antifuse region, and selectively removing the area corresponding to the antifuse region. In forming the first aperture 11a, a method of conducting a dry-etching after wet-etching is preferred. Through the wet-etching process the edge part of the first aperture 11a is removed to provide a tapered shape broadening upward, which improves the step coverage in the stepping section of the upper electrode layer 6. The dry-etching conducted after the wet-etching provides a damage layer on the surface of amorphous silicon film 10, and the oxidization rate of the surface of amorphous silicon film 10 is raised. Because of this, the surface of amorphous silicon film 10 is easily oxidized during an ash treating process with oxygen plasma to be conducted for removing the resist material which was used in forming the aperture. Namely, the resist removal and the surface oxidization of amorphous silicon film 10 are conducted by one common process, and the process flow is simplified.

Figure 2D:
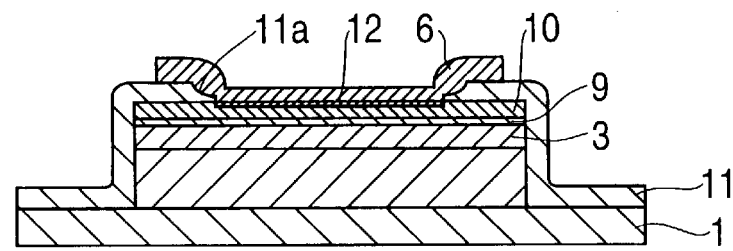

Then, as shown in FIG. 2(d), an upper electrode layer 6 is formed to a specified pattern, by once forming a 200–300 nm thick titanium nitride film and then selectively removing unnecessary portion. The thickness of the thinnest part of the upper electrode layer 6 of antifuse element is made to be thicker than 80% of the thickest part.

Figure 2E:
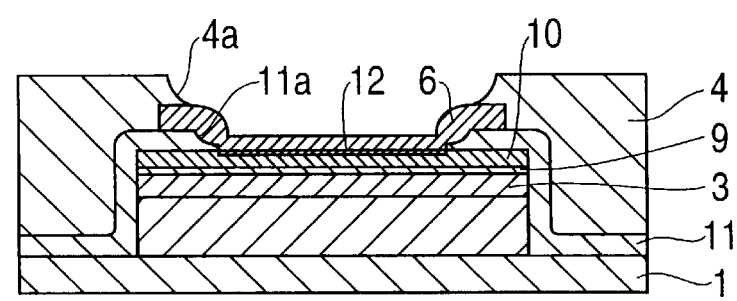

As shown in FIG. 2(e), a silicon oxide is stacked on the above described constituent elements by a plasma CVD process using TEOS. The surface of stacked layer is planarized to form a second interlayer insulating film 4. The second interlayer insulating film 4 has a thickness of 500–1000 nm. A second aperture 4a is formed through the second interlayer insulating film 4 by selectively removing a portion above the upper electrode layer 6 using a resist film mask.

Figure 2F:
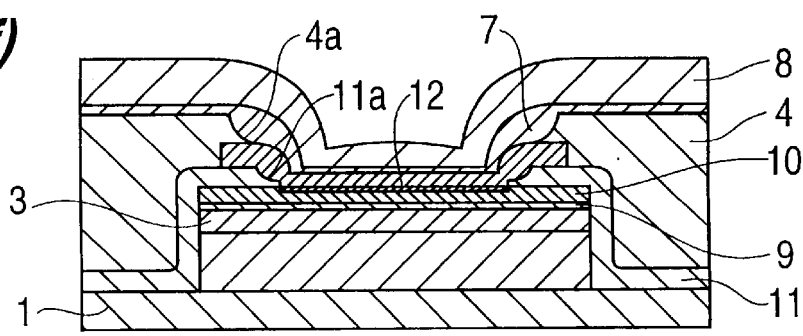
Figure 3:
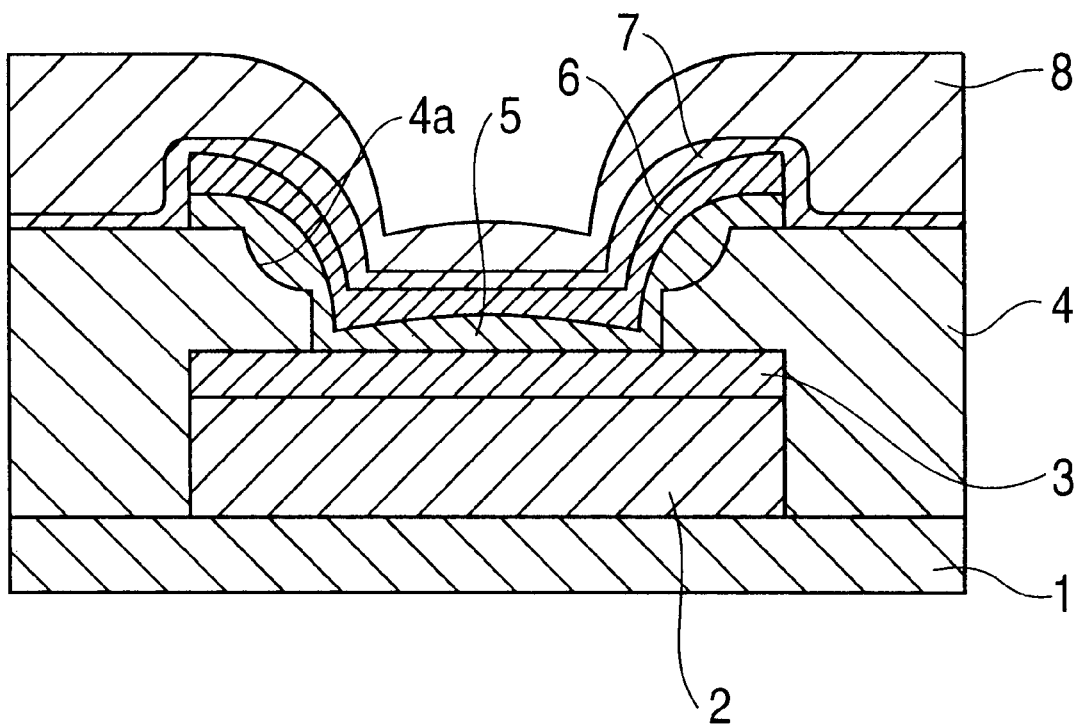
FIG. 3 is a cross sectional view showing a conventional antifuse element.
Figure 4A:
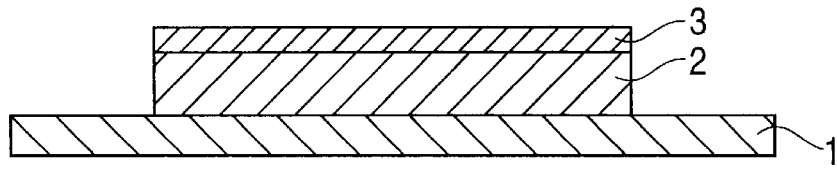
FIG. 4(a), FIG. 4(b), FIG. 4(c) and FIG. 4(d) are charts explaining a process for manufacturing a conventional antifuse element.
Figure 4B:
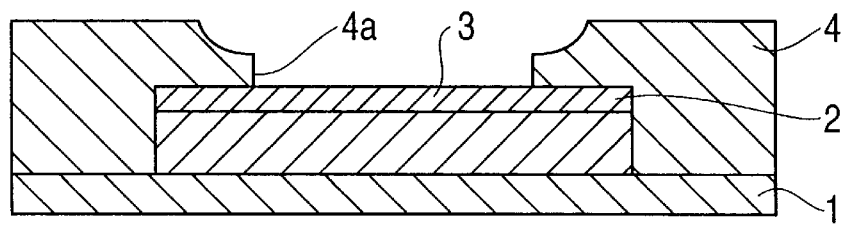
Figure 4C:
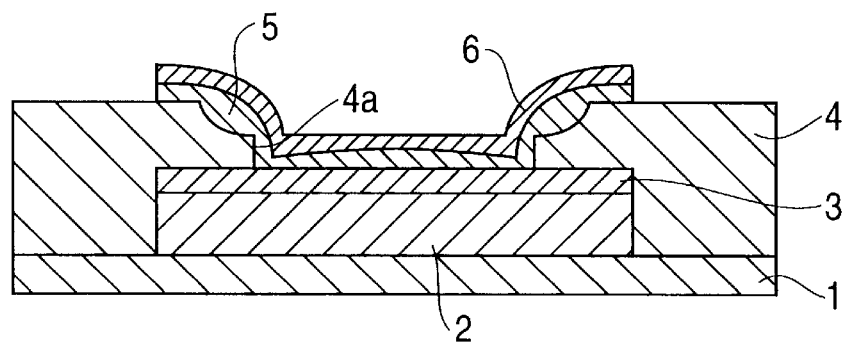
Figure 4D:
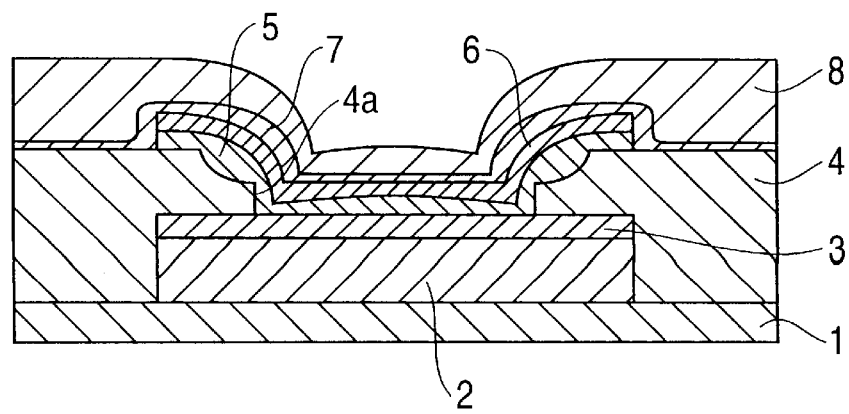

Then, as shown in FIG. 2(f), a barrier matal layer 7 and a second interconnection layer 8 is formed one after another on the upper electrode layer 6 exposed through the second aperture 4a and on the second interlayer insulating film 4.

In a manufacturing method according to the present embodiment, a silicon nitride film 9 and an amorphous silicon film 10 constituting the antifuse layer 13 are formed before stacking the electrodes separating insulation film 11. This makes it easy to control the film thickness of these films, and makes it possible to control the insulation breakdown voltage of antifuse element in "off" state. By plasma-oxidizing the surface region of amorphous silicon film 10, an even silicon oxide film 12 is formed ed, and the leakage current of antifuse element in "off" state is reduced. By forming first aperture 11a through electrode separating insulation film 11 by a dry-etching process after wet-etching, the stepping section of the first aperture 11a is provided with a tapered shape. Thereby, the step coverage of titanium nitride film, which is to become upper electrode layer 6, is improved, making the control of film thickness easy. Accordingly, it becomes easy to prevent a fuse link from invading the second interconnection layer 8 at programming, and a resulting aluminum diffusion into the fuse link is also prevented. This avoids the reliability deterioration of an antifuse element in "on" state.

In forming the first aperture 11a through the electrodes separating insulation film 11 a dry-etching process is employed. A damage layer formed on the surface of amorphous silicon film 10 during the dry-etching provides a positive effect to promote the rate of plasma oxidization. This makes it easy to form a silicon oxide film on amorphous silicon film 10. And the leakage current of antifuse element in "off" state is suppressed.

When removing the resist material by ashing with an oxygen plasma after a first aperture 11a is formed through the electrodes separating insulation film 11, the surface of amorphous silicon film 10 is plasma-oxidized simultaneously. This contributes to simplify the process flow.

Although in the present embodiment the antifuse layer 13 is comprised of a complex film and the edge of the first aperture 11a is tapered, the antifuse layer 13 may of course be comprised of a single layered insulation film for obtaining an effect of the present invention which enables the control of insulation breakdown voltage, if basically the even thickness of antifuse layer 13 is assured for a region where the lower electrode layer 3 and the upper electrode layer 6 are to contact.

As described in the above, according to the present invention the insulation breakdown voltage of antifuse element in "off" state is easily controlled. Furthermore, the use of an antifuse layer comprised of a complexed film of amorphous silicon film, silicon nitride film and silicon oxide film provides an effective advantage that the polarity control of current/voltage characteristics of antifuse element in "off" state turns out to be possible, at the same time the leakage current in "off" state is suppressed either.

The reliability deterioration of an antifuse element in "on" state is avoidable by setting the film thickness of the upper electrode layer and the lower electrode layer to be thicker than the invading length into the electrode layers of a fuse link to be formed after the programming. Furthermore, by constituting the electrode layers with a titanium nitride film the dispersion in insulation breakdown voltage of antifuse element in "off" state may be suppressed.

By making the film thickness of the electrodes separating insulation film of antifuse element to be thinner than the interlayer insulating film for insulating between the metal interconnections, and by providing an aperture formed through the electrodes separating insulation film with a tapered shape, the reliability deterioration of antifuse element in "on" state is avoidable.

In a method of the present invention for manufacturing an antifuse element, a lower electrode layer and an antifuse layer are formed first, and then an electrodes separating insulation film is formed and an aperture is provided thereon. The antifuse layer thus formed has an even thickness, making it easy to control the insulation breakdown voltage. The use of a plasma-oxidizing process on the surface of amorphous silicon film as the antifuse layer, or the use of a dry-etching process after wet-etching in forming an aperture through an electrodes separating insulation film, makes it easy to control the insulation breakdown voltage of an antifuse element in "off" state, suppress the dispersion of insulation breakdown voltage, enables the polarity control of voltage/current characteristics, suppresses the leakage current, furthermore, prevents the deterioration of reliability in "on" state.

What is claimed is:

1. A method for manufacturing an antifuse element comprising the steps of:

(a) forming a first interconnection layer on an insulating film;

(b) forming a flat lower electrode layer on a flat region of said first interconnection layer;

(c) forming a silicon nitride film on said lower electrode layer, and an amorphous silicon film on said silicon nitride film;

(d) forming patterned layers of said first interconnection layer, said lower electrode layer, said silicon nitride film and said amorphous silicon film, by removing said first interconnection layer, said lower electrode layer, said silicon nitride film and said amorphous silicon film selectively;

(e) forming an insulation film for separating electrode layers to cover said patterned layers;

(f) forming an etching mask on said insulation film for separating electrode layers selectively in order to form an antifuse region on said patterned layers;

(g) forming (i) an aperture through said insulation film for separating electrode layers to expose said amorphous silicon film, and (ii) a damage layer on a surface of said amorphous silicon film, by dry-etching after wet etching by using said etching mask;

(h) forming a silicon oxide film on said amorphous silicon film by plasma-oxidizing the surface of said amorphous silicon film on which said damage layer is formed; and (i) forming an upper electrode layer that covers the aperture of said insulation film for separating electrode layers, wherein said lower electrode layer and said upper electrode layer are separated by said insulation film for separating electrode layers, and an antifuse layer comprises said silicon nitride film, said amorphous silicon film and said silicon oxide film.

2. A method for manufacturing antifuse element as claimed in claim 1, wherein said process for plasma-oxidizing the surface of said amorphous silicon film is a process which simultaneously removes a resist film used for forming said aperture through said insulation film for separating electrode layers by treating in oxygen plasma and oxidizing the surface of said amorphous silicon film with said oxygen plasma.

* * * * *